United States Patent
Zhang

(10) Patent No.: US 12,340,833 B2
(45) Date of Patent: Jun. 24, 2025

(54) REFRESH CONTROL CIRCUIT, MEMORY, AND REFRESH CONTROL METHOD

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 246 days.

(21) Appl. No.: 18/157,558

(22) Filed: Jan. 20, 2023

(65) Prior Publication Data

US 2023/0386549 A1 Nov. 30, 2023

Related U.S. Application Data

(63) Continuation of application No. PCT/CN2022/099237, filed on Jun. 16, 2022.

(30) Foreign Application Priority Data

May 25, 2022 (CN) .......................... 202210579572.4

(51) Int. Cl.
  *G11C 11/40* (2006.01)
  *G11C 11/406* (2006.01)
(52) U.S. Cl.
  CPC ............... *G11C 11/40615* (2013.01)
(58) Field of Classification Search
  CPC .............. G11C 11/40615; G11C 5/148; G11C 2211/4068; G11C 11/4074; G11C 2211/4067
  See application file for complete search history.

(56) References Cited

U.S. PATENT DOCUMENTS

| | | | |
|---|---|---|---|
| 7,043,599 B1 | 5/2006 | Ware | |
| 2004/0160839 A1* | 8/2004 | Kim | G11C 11/406 365/222 |
| 2006/0004955 A1 | 1/2006 | Ware | |
| 2008/0056046 A1* | 3/2008 | Oh | G11C 11/406 365/222 |

(Continued)

FOREIGN PATENT DOCUMENTS

| | | |
|---|---|---|
| CN | 108255751 A | 7/2018 |
| CN | 110931067 A | 3/2020 |

(Continued)

*Primary Examiner* — Mohammed A Bashar
(74) *Attorney, Agent, or Firm* — Syncoda LLC; Feng Ma

(57) ABSTRACT

A refresh control circuit includes: a processing circuit, configured to receive a refresh command signal, and perform pulse combination processing on the refresh command signal to obtain a refresh combined signal, the refresh command signal having a plurality of pulses in a first time period and keeping a level state unchanged in a second time period, and the first time period and the second time period existing alternately; a logic circuit, configured to receive the refresh command signal and the refresh combined signal, and perform logical operation processing on the refresh command signal and the refresh combined signal to obtain a target control signal; and a power supply circuit, configured to receive the target control signal, and determine whether to perform a power supply operation according to the level state of the target control signal.

18 Claims, 5 Drawing Sheets

(56) References Cited

U.S. PATENT DOCUMENTS

| | | |
|---|---|---|
| 2009/0248972 A1 | 10/2009 | Ware |
| 2010/0157713 A1* | 6/2010 | Furutani .................. G11C 8/06 |
| | | 365/222 |
| 2018/0151215 A1 | 5/2018 | Ware et al. |
| 2019/0043558 A1 | 2/2019 | Suh et al. |
| 2019/0221252 A1 | 7/2019 | Suh et al. |
| 2020/0090733 A1 | 3/2020 | Lee |
| 2020/0126611 A1 | 4/2020 | Riho et al. |
| 2020/0279599 A1 | 9/2020 | Ware et al. |
| 2020/0321051 A1 | 10/2020 | Suh et al. |
| 2021/0166753 A1 | 6/2021 | Riho et al. |
| 2021/0343331 A1 | 11/2021 | Suh et al. |
| 2021/0383858 A1 | 12/2021 | Kim et al. |

FOREIGN PATENT DOCUMENTS

| | | |
|---|---|---|
| CN | 110945589 A | 3/2020 |
| CN | 112823389 A | 5/2021 |
| CN | 113764013 A | 12/2021 |

\* cited by examiner

REFRESH CONTROL CIRCUIT, MEMORY, AND REFRESH CONTROL METHOD

CROSS-REFERENCE TO RELATED APPLICATIONS

This is a continuation of International Patent Application No. PCT/CN2022/099237 filed on Jun. 16, 2022, which claims priority to Chinese Patent Application No. 202210579572.4 filed on May 25, 2022. The disclosures of the above-referenced applications are hereby incorporated by reference in their entirety.

BACKGROUND

In a self-refresh mode of a Dynamic Random Access Memory (DRAM), when a refresh operation is performed, the memory needs to be in a refresh state; and after the refresh operation is completed, the memory needs to return to an idle state. However, repeated switching of the memory between the refresh state and the idle state results in the current loss, which adversely affects the performance of the memory.

SUMMARY

The present disclosure relates to the technical field of semiconductor memories, and provides a refresh control circuit, a memory, and a refresh control method, which may provide centralized power supply for a plurality of refresh operations to reduce the current loss.

The technical solutions of the present disclosure are implemented as follows.

In a first aspect, the embodiments of the present disclosure provide a refresh control circuit, which is applied to a memory and may include a processing circuit, a logic circuit and a power supply circuit.

The processing circuit may be configured to receive a refresh command signal, and perform pulse combination processing on the refresh command signal to obtain a refresh combined signal. The refresh command signal has a plurality of pulses in a first time period and keeps a level state unchanged in a second time period, and the first time period and the second time period exist alternately.

The logic circuit may be configured to receive the refresh command signal and the refresh combined signal, and perform logical operation processing on the refresh command signal and the refresh combined signal to obtain a target control signal. The target control signal has different level states in the first time period and the second time period.

The power supply circuit may be configured to receive the target control signal, and determine whether to perform a power supply operation according to the level state of the target control signal. The power supply operation is configured to support execution of a refresh operation.

In a second aspect, the embodiments of the present disclosure provide a memory. The memory may include a refresh controller and a refresh control circuit.

The refresh controller may be configured to generate a refresh command signal. The refresh command signal has a plurality of pulses in a first time period and keeps a level state unchanged in a second time period, and the first time period and the second time period exist alternately.

The refresh control circuit may be configured to receive the refresh command signal, and perform pulse combination and logic operation processing on the refresh command signal to obtain a target control signal, the target control signal having different level states in the first time period and the second time period; and, determine whether to perform a power supply operation according to the level state of the target control signal, the power supply operation being configured to support execution of a refresh operation.

In a third aspect, the embodiments of the present disclosure provide a refresh control method, which is applied to a memory including a refresh control circuit, and may include the following operations.

A refresh command signal is determined. The refresh command signal has a plurality of pulses in a first time period and keeps a level state unchanged in a second time period, and the first time period and the second time period exist alternately.

Pulse combination and logic operation processing are performed on the refresh command signal to obtain a target control signal. The target control signal has different level states in the first time period and the second time period.

It is determined whether the refresh control circuit performs a power supply operation according to the level state of the target control signal. The power supply operation may be configured to support execution of a refresh operation.

The embodiments of the present disclosure provide a refresh control circuit, a memory, and a refresh control method. The plurality of refresh operations are generated in the first time period, so that the power supply operation is performed in a centralized manner in the first time period. Therefore, for the plurality of refresh operations, the power supply circuit only needs to be switched on and off once, which reduces the switching times of the power supply circuit, saves the current loss, and improves the performance of the memory.

DETAILED DESCRIPTION

Figure 1:
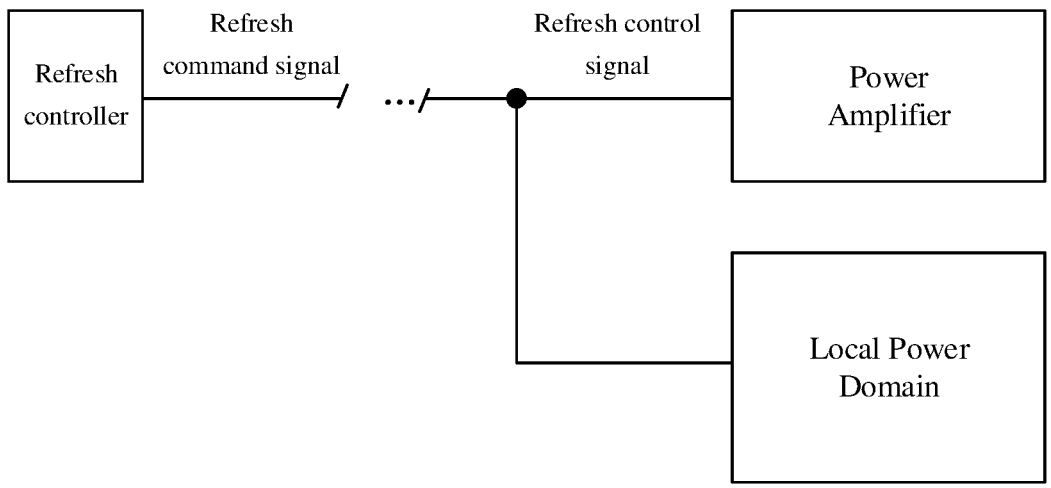
FIG. 1 is a schematic diagram of a partial structure of a memory.

The technical solutions in the embodiments of the present disclosure will be clearly and completely described in conjunction with the drawings in the embodiments of the present disclosure. It should be understood that that the specific embodiments described herein are only used to illustrate the relevant disclosure, but are not intended to limit the disclosure. In addition, it is to be noted that, for the convenience of description, only the parts related to the relevant disclosure are shown in the drawings.

Unless otherwise defined, all technical and scientific terms used herein have the same meaning as commonly understood by those skilled in the art of the present disclosure. The terms used herein are only for describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first\second\third" involved in the embodiments of the present disclosure are only used to distinguish similar objects, and do not represent a specific order of the objects. It should be understood that the specific order or sequence of "first\second\third" may be interchangeable under the allowable circumstances, so that the embodiments of the disclosure described herein may be implemented in an order other than those illustrated or described herein.

A memory, such as a DRAM, needs to be refreshed to keep data valid. In a self-refresh mode, the current loss mainly exists in the following two aspects: refresh current generated in a memory array, and control current of a peripheral circuit.

Specifically, in the self-refresh mode, the memory has a refresh state and an idle state (IDLE). When performing a refresh operation, the memory needs to be switched from the idle state to the refresh state, and turn on a Power Amplifier and a Local Power Domain of a Row signal required for refresh. Herein, the Power Amplifier is configured to provide the control current of the peripheral circuit, and the Local Power Domain is configured to provide the refresh current generated in the memory array, that is, both the Power Amplifier and the Local Power Domain are configured to provide power for the refresh operation. After the refresh operation is completed, the memory needs to be switched from the refresh state to the idle state, and turn off the Power Amplifier and Local Power Domain.

Figure 2:
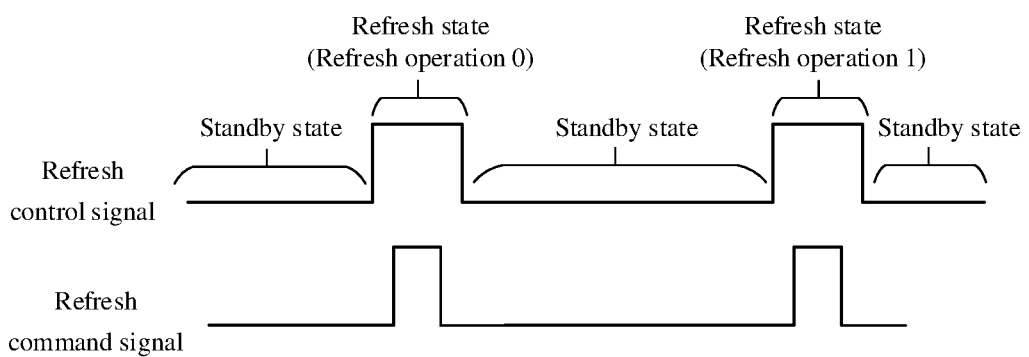
FIG. 2 is a schematic diagram of signal timing.

Referring to FIG. 1, FIG. 1 shows a schematic diagram of a partial structure of a memory. Referring to FIG. 2, FIG. 2 shows a schematic diagram of signal timing. As shown in FIG. 1 and FIG. 2, a refresh controller (or called Refresh Controller) is configured to generate a refresh command signal (or called Refresh Command), and a pulse in the refresh command signal indicates one refresh operation. The refresh command signal is processed to a refresh control signal (or called Refresh Control), the pulses in the refresh command signal are in one-to-one correspondence with the pulses in the refresh control signal, and the pulse width in the refresh control signal is slightly larger than that in the refresh command signal. The refresh control signal is input to the Power Amplifier and the Local Power Domain, and a rising edge of the refresh control signal is used to turn on the Power Amplifier and the Local Power Domain, and the memory is switched to the refresh state, thereby performing the refresh operation 0 or the refresh operation 1. A falling edge of the refresh control signal is used to turn off the Power Amplifier and the Local Power Domain, and the memory is switched to a standby state. That is, each refresh operation may cause the Power Amplifier and the Local Power Domain to be turned on and off.

However, after each time the Power Amplifier and the Local Power Domain are turned on or off, corresponding current consumption may be generated, which adversely affects the performance of the memory.

Based on this, the embodiments of the present disclosure provide a refresh control circuit. The refresh control circuit includes a processing circuit, a logic circuit, and a power supply circuit. The processing circuit is configured to receive a refresh command signal, and perform pulse combination processing on the refresh command signal to obtain a refresh combined signal. The refresh command signal has a plurality of pulses in a first time period, and keeps a level state unchanged in a second time period, and the first time period and the second time period exist alternately. The logic circuit is configured to receive the refresh command signal and the refresh combined signal, and perform logical operation processing on the refresh command signal and the refresh combined signal to obtain a target control signal. The target control signal has different level states in the first time period and the second time period. The power supply circuit is configured to receive the target control signal, and determine whether to perform a power supply operation according to the level state of the target control signal. The power supply operation is used to support execution of a refresh operation. In this way, a plurality of refresh operations are generated in the first time period, and the power supply operation is performed in a centralized manner in the first time period. Therefore, for the plurality of refresh operations, the power supply circuit only needs to be switched on and off once, which reduces the switching times of the power supply circuit, saves the current loss, and improves the performance of the memory.

The embodiments of the present disclosure will be described in detail below with reference to the accompanying drawings.

Figure 3:
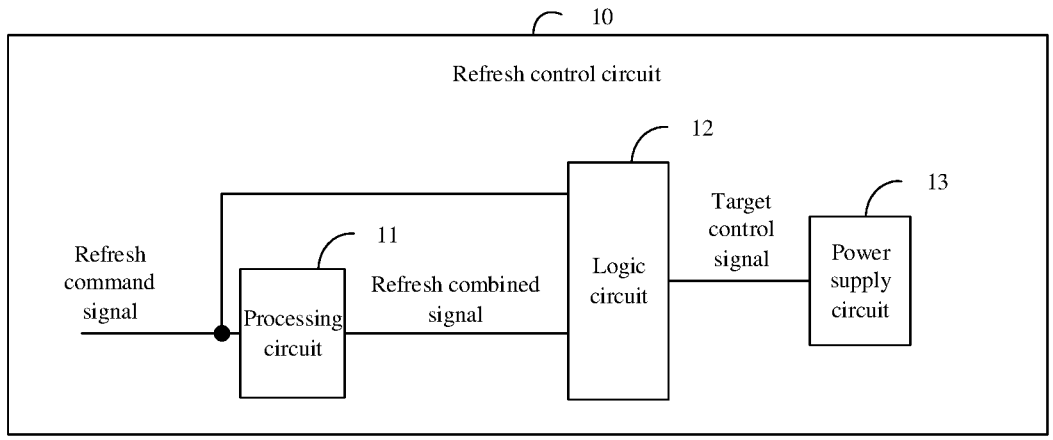
FIG. 3 is a schematic structural diagram of a refresh control circuit according to an embodiment of the present disclosure.

In an embodiment of the present disclosure, FIG. 3 shows a schematic structural diagram of a refresh control circuit 10 according to an embodiment of the present disclosure. As shown in FIG. 3, the refresh control circuit 10 may include: a processing circuit 11, a logic circuit 12, and a power supply circuit 13.

The processing circuit 11 is configured to receive a refresh command signal, and perform pulse combination processing on the refresh command signal to obtain a refresh combined signal. Herein, the refresh command signal has a plurality of pulses in a first time period, the refresh command signal keeps a level state unchanged in a second time period, and the first time period and the second time period exist alternately.

The logic circuit 12 is configured to receive the refresh command signal and the refresh combined signal, and perform logical operation processing on the refresh command signal and the refresh combined signal to obtain a target control signal. The target control signal has different level states in the first time period and the second time period.

The power supply circuit 13 is configured to receive the target control signal, and determine whether to perform a power supply operation according to the level state of the target control signal. The power supply operation is used to support execution of a refresh operation.

It is to be noted that the refresh control circuit 10 in the embodiment of the present disclosure may be applied to a memory, such as a DRAM and a Synchronous Dynamic Random Access Memory (SDRAM), which may reduce the current loss during the refresh process.

Here, the power supply circuit 13 may include the Power Amplifier and the Local Power Domain mentioned above.

When the power supply circuit 13 performs the power supply operation, the memory is in a refresh state and allows to perform the refresh operation. When the power supply circuit 13 does not perform the power supply operation, the memory is in an idle state and may not perform the refresh operation.

Figure 4:
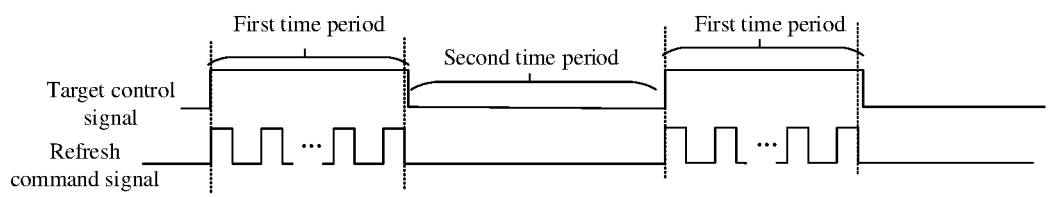
FIG. 4 is a schematic diagram of signal timing according to an embodiment of the present disclosure.

It is to be noted that a pulse in the refresh command signal is used to indicate one refresh operation, and the refresh control circuit 10 may perform the refresh operations in the first time period in a centralized manner, thereby saving the switching times of the power supply circuit. Exemplarily, FIG. 4 shows a schematic diagram of signal timing according to an embodiment of the present disclosure. As shown in FIG. 4, the refresh command signal has a plurality of pulses in the first time period, and the target control signal may keep the level state unchanged in the first time period until it is adjusted to another power level state in the second time period, so that the power supply circuit 13 always performs the power supply operation in the first time period, and does not perform the power supply operation in the second time period.

In this way, since the plurality of refresh operations are performed in the first time period in a centralized manner, the power supply operation only needs to be performed in the first time period, and the power supply circuit only needs to be switched on and off once for the plurality of refresh operations, which reduces the switching times of the power supply circuit, saves the current loss, and improves the performance of the memory.

In some embodiments, the processing circuit 11 is specifically configured to control the refresh combined signal to be adjusted from a first state to a second state according to a first signal edge of the refresh command signal in the first time period; and control the refresh combined signal to be adjusted from the second state to the first state according to the last signal edge of the refresh command signal in the first time period.

It is to be noted that the first state and the second state are different. For example, the first state refers to a high level state, and the second state refers to a low level state; or, the first state refers to a low level state, and the second state refers to a high level state, depending on the actual application scenario. Here, the high level state allows an N-type field effect transistor to be turned on, and the low level state allows a P-type field effect transistor to be turned on.

The signal edge refers to a rising edge or a falling edge, the rising edge is generated when the signal is switched from the low level state to the high level state, and the falling edge is generated when the signal is switched from the high level state to the low level state. In the above description, the first signal edge may be the rising edge, and in such case, the last signal edge is the falling edge. Alternatively, the first signal edge is the falling edge, and in such case, the last signal edge is the rising edge.

Figure 5:
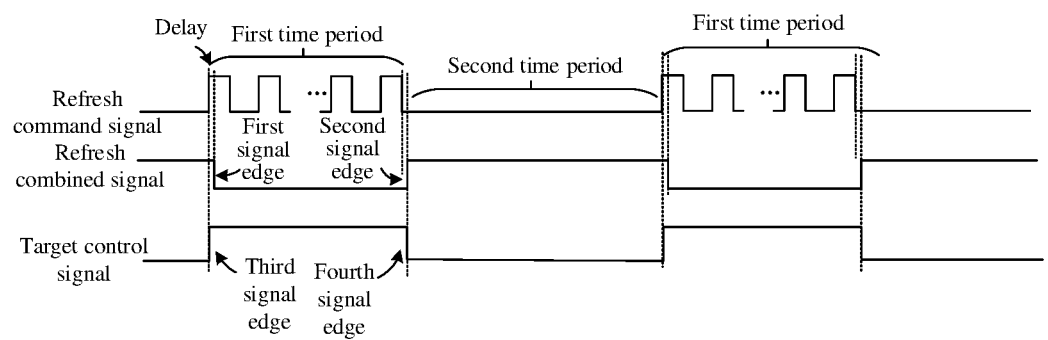
FIG. 5 is a schematic diagram of another signal timing according to an embodiment of the present disclosure.

In a specific embodiment, FIG. 5 shows a schematic diagram of another signal timing according to an embodiment of the present disclosure. As shown in FIG. 5, assuming that the refresh command signal has N pulses in the first time period, and after the first rising edge, the refresh combined signal is adjusted from the high level state to the low level state. After the N-th falling edge, the refresh combined signal is adjusted from the low level state to the high level state. N is a positive integer. In addition, since the refresh combined signal is generated by the refresh command signal, there is a certain delay between the two signals.

In this way, the time period in which the refresh command signal has the plurality of pulses corresponds to the time period in which the refresh combined signal is in the second state, thereby implementing pulse combination processing.

Figure 6:
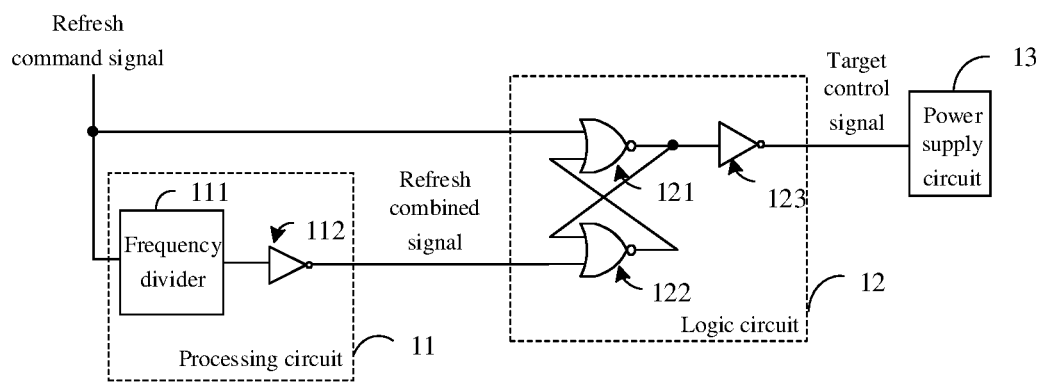
FIG. 6 is a schematic structural diagram of another refresh control circuit according to an embodiment of the present disclosure.

In some embodiments, as shown in FIG. 6, the processing circuit 11 may include a frequency divider 111 and a first inverter 112.

The frequency divider 111 is configured to receive the refresh command signal, and perform frequency division processing on the refresh command signal to obtain a frequency-divided signal.

The first inverter 112 is configured to receive the frequency-divided signal, and perform inversion processing on the frequency-divided signal to obtain a refresh combined signal. The number of pulses of the refresh command signal in the first time period is a fixed value.

It is to be noted that the pulse width of the frequency-divided signal is the duration of the plurality of pulses of the refresh command signal in the first time period.

In addition, the processing circuit 11 is also configured to perform reset processing on the frequency divider in the second time period. In this way, as shown in FIG. 5, after the first rising edge of the refresh command signal in the first time period, the refresh combined signal is adjusted from the high level state to the low level state. After the N-th falling edge of the refresh command signal in the first time period, the refresh combined signal is adjusted from the low level state to the high level state. Then, in the second time period, since reset processing is performed on the frequency divider 111, the level state of the refresh combined signal is kept unchanged until the refresh command signal generates a new pulse.

It is also to be noted that the first inverter 112 may also be arranged in front of the frequency divider 111, that is, the refresh command signal is first input into the input end of the first inverter 112, then the output end of the first inverter 112 is connected to the input end of the frequency divider 111, and the frequency divider 111 is configured to output the refresh combined signal.

Figure 7:
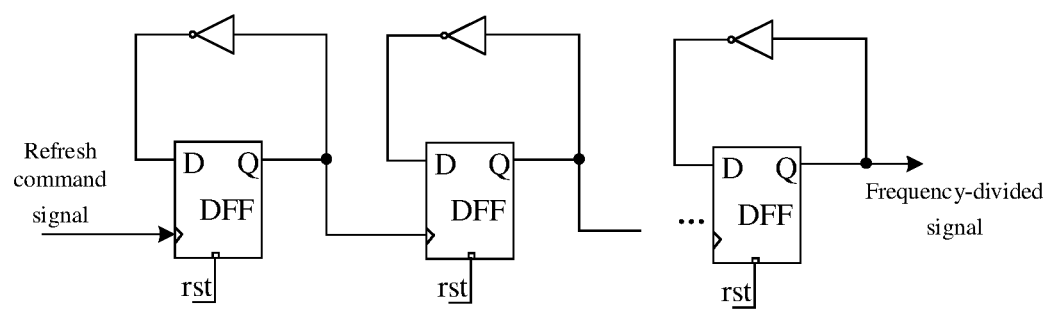
FIG. 7 is a schematic structural diagram of a frequency divider according to an embodiment of the present disclosure.

In some embodiments, as shown in FIG. 7, the frequency divider 111 includes A flip-flops and A second inverters. Herein, an input end of the i-th flip-flop is connected with an output end of the i-th second inverter, and an output end of the i-th flip-flop is connected with an input end of the i-th second inverter. A clock end of the first flip-flop is configured to receive the refresh command signal. When i is greater than or equal to 2, a clock end of the i-th flip-flop is connected with an output end of the (i−1)-th flip-flop. An output end of the A-th flip-flop is configured to output the frequency-divided signal. Herein, A is a positive integer greater than 1, and i is a positive integer less than or equal to A.

It is to be noted that the number of flip-flops in the frequency divider 111 may be determined according to the actual application scenario. As shown in FIG. 7, each flip-flop is also provided with a reset end configured to receive a reset signal rst and perform reset processing according to the reset signal rst.

In some embodiments, the target control signal is in a third state in the first time period, and the target control signal is in a fourth state in all or part of the second time period.

The power supply circuit 13 is specifically configured to be adjusted, in a case where the target control signal is in the third state, to an on state to perform the power supply operation; or, to be adjusted, in a case where the target control signal is in the fourth state, to an off state to perform no power supply operation.

It is to be noted that the third state is different from the fourth state, the third state is a high level state, and the fourth state is a low level state; or, the third state is the low level state, and the fourth state is the high level state, depending on the actual application scenario.

Here, the target control signal must be all in the third state in the first time period, so that the power supply circuit 13 is always in the on state in the first time period to ensure that the N refresh operations may be performed smoothly, otherwise the target control signal may be partially in the fourth state in the second time period. That is, the time when the target control signal is in the third state may be longer than the first time period on the premise of covering the first time period, thereby providing some redundant turn-on time.

In this way, the power supply circuit 13 only needs to perform state switching according to the target control signal, and does not need to be switched repeatedly during the execution of the N refresh operations, thereby reducing power consumption.

In a specific embodiment, as shown in FIG. 5, the first state and the third state are both high level states, and the second state and the fourth state are both low level states. For the convenience of description, the signal edge generated by adjusting the refresh combined signal from the first state to the second state is called the first signal edge, and the signal edge generated by adjusting the refresh combined signal from the second state to the first state is called the second signal edge. The signal edge generated by adjusting the target control signal from the fourth state to the third state is called the third signal edge, and the signal edge generated by adjusting the target control signal from the third state to the fourth state is called the fourth signal edge.

As shown in FIG. 5, the first signal edge is delayed from the first signal edge of the refresh command signal in the corresponding first time period, and the second signal edge is delayed from the last signal edge of the refresh command signal in the corresponding first time period. Therefore, the logic circuit 12 is required to perform further operations on the refresh combined signal and the refresh command signal to ensure that the third state of the target control signal may completely cover the first time period.

In some embodiments, as shown in FIG. 6, the logic circuit 12 may include a first NOR gate 121, a second NOR gate 122 and a third inverter 123. Herein, the first input end of the first NOR gate 121 is connected with the refresh command signal, and the first input end of the second NOR gate 122 is connected with the refresh combined signal. The second input end of the first NOR gate 121 is connected with the output end of the second NOR gate 122, and the second input end of the second NOR gate 122 and the input end of the third inverter 123 are both connected with the output end of the first NOR gate 121. The output end of the third inverter 123 is configured to output the target control signal.

In this way, referring to FIG. 5, the third signal edge of the target control signal is aligned with the first signal edge of the refresh command signal in the corresponding first time period, and the fourth signal edge of the target control signal is aligned with the corresponding second signal edge, that is, the power supply circuit 13 always performs the power supply operation in the first time period to support the execution of the plurality of refresh operations.

The embodiments of the present disclosure provide a refresh control circuit. By optimizing the refresh control, the plurality of refresh operations may be performed in a centralized manner, which may greatly reduce the switching times of the power supply circuit, thereby achieving the purpose of reducing current consumption.

Figure 8:
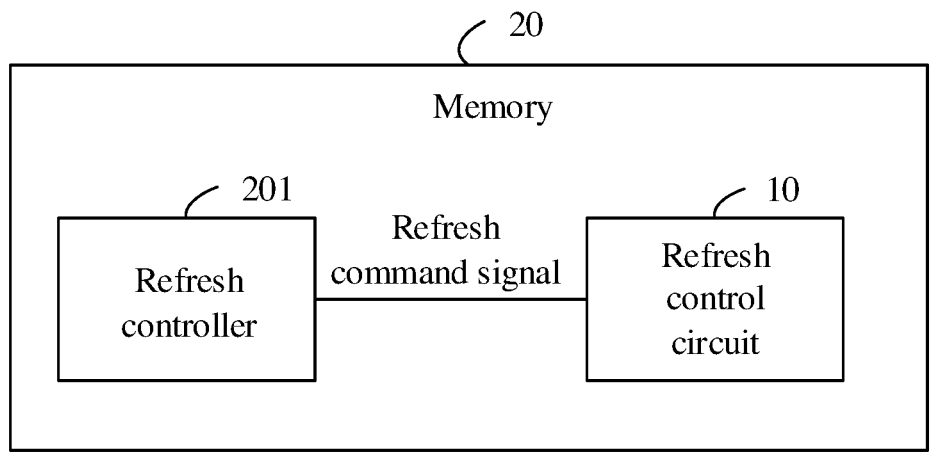
FIG. 8 is a schematic structural diagram of a memory according to an embodiment of the present disclosure.

In another embodiment of the present disclosure, referring to FIG. 8, FIG. 8 shows a schematic structural diagram of compositions of a memory 20 according to an embodiment of the present disclosure. As shown in FIG. 8, the memory 20 may include a refresh controller 201 and a refresh control circuit 10.

The refresh controller 201 is configured to generate a refresh command signal. The refresh command signal has a plurality of pulses in a first time period, the refresh command signal keeps a level state unchanged in a second time period, and the first time period and the second time period exist alternately.

The refresh control circuit 10 is configured to receive the refresh command signal, and perform pulse combination and logic operation processing on the refresh command signal to obtain a target control signal, the target control signal having different level states in the first time period and the second time period; and, to determine whether to perform a power supply operation according to the level state of the target control signal. The power supply operation is used to support execution of a refresh operation.

It is to be noted that one pulse in the refresh command signal indicates one refresh operation. That is, the memory 20 may perform the plurality of refresh operations in a centralized manner within the first time period, thereby reducing the switching times of the power supply operation and saving the current loss.

Figure 9:
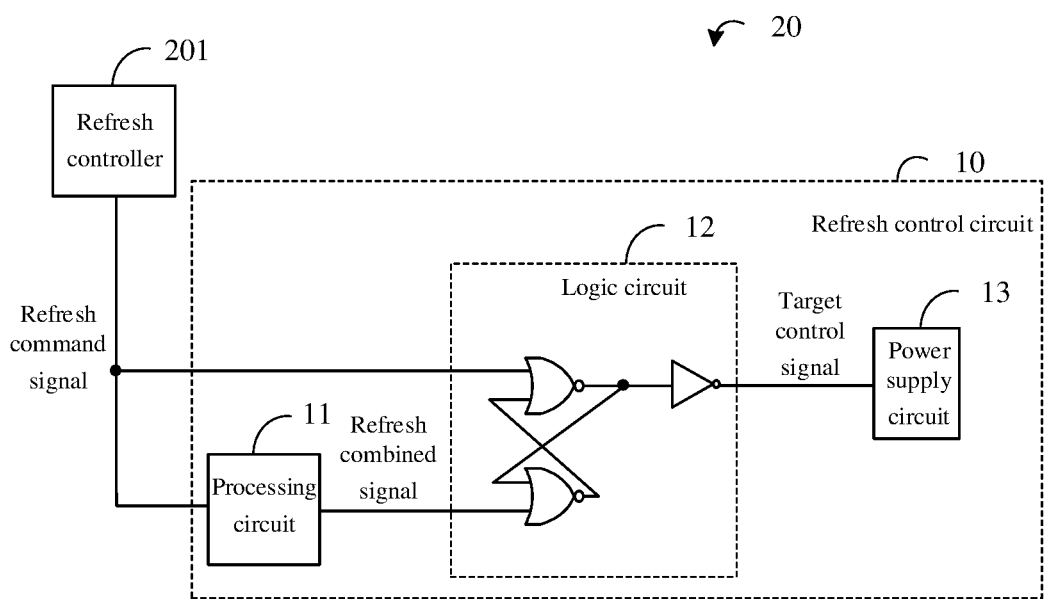
FIG. 9 is a schematic structural diagram of another memory according to an embodiment of the present disclosure.

As shown in FIG. 9, the refresh control circuit 10 may include a processing circuit 11, a logic circuit 12 and a power supply circuit 13, the specific structures of which may refer to the above content.

On the basis of FIG. 9, in some implementations, the target control signal is in a third state in the first time period, and the target control signal is in a fourth state in all or part of the second time period.

The refresh control circuit 10 is also configured to adjust, in a case where the target control signal is in the third state, the power supply circuit 13 to an on state to perform the power supply operation; or, adjust, in a case where the target control signal is in the fourth state, the power supply circuit 13 to an off state to perform no power supply operation.

It is to be noted that the third state of the target control signal covers at least the first time period, so that the refresh control circuit 10 always supplies power in the first time period to support the execution of the plurality of refresh operations.

In some embodiments, memory 20 may also include a memory array.

The memory array is connected with the refresh controller 201 and the refresh control circuit 10, and is configured to receive the refresh command signal and perform, in a case where the refresh control circuit 10 performs the power supply operation, the refresh operation once according to a pulse in the refresh command signal.

The embodiments of the present disclosure provide a memory. By optimizing the refresh control, the plurality of refresh operations may be performed in a centralized manner, which may greatly reduce the switching times of the power supply operation, thereby achieving the purpose of reducing current consumption.

Figure 10:
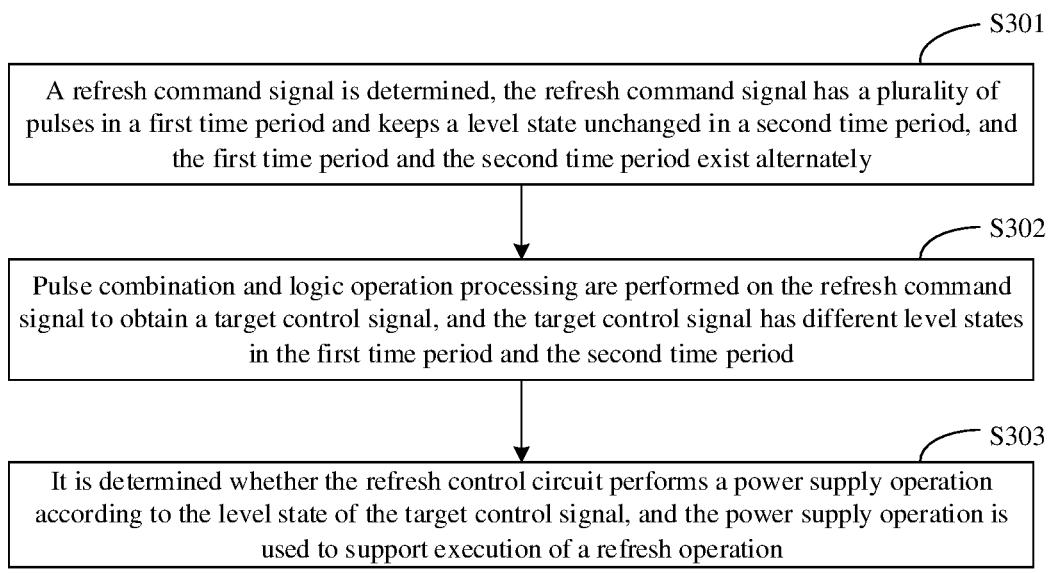
FIG. 10 is a schematic flowchart of a refresh control method according to an embodiment of the present disclosure.

In some embodiments of the present disclosure, referring to FIG. 10, FIG. 10 shows a schematic flowchart of a refresh control method according to an embodiment of the present disclosure. As shown in FIG. 10, the method may include the following operations.

At S301, a refresh command signal is determined. The refresh command signal has a plurality of pulses in a first time period and keeps a level state unchanged in a second time period, and the first time period and the second time period exist alternately.

It is to be noted that the refresh control method provided by the embodiment of the present disclosure is applied to a memory 20 including a refresh control circuit 10, and the specific structure of the refresh control circuit 10 may refer to the above content.

At S302, pulse combination and logic operation processing are performed on the refresh command signal to obtain a target control signal. The target control signal has different level states in the first time period and the second time period.

At S303, it is determined whether the refresh control circuit performs a power supply operation according to the level state of the target control signal. The power supply operation is used to support execution of a refresh operation.

In some embodiments, in a case where the refresh control circuit performs the power supply operation, the memory is controlled to perform the refresh operation once according to a pulse in the refresh command signal.

In this way, the plurality of refresh operations are performed in a centralized manner in the first time period, so that only centralized power supply is needed in the first time period, which reduces the switching times of the power supply operations, reduces the circuit consumption, and improves the performance of the memory.

In some embodiments, the target control signal is in a third state in the first time period and the target control signal is in a fourth state in all or part of the second time period. The operation that it is determined whether the refresh control circuit in the memory performs the power supply operation according to the level state of the target control signal may include the following operations.

In a case where the target control signal is in the third state, the refresh control circuit is adjusted to an on state to perform the power supply operation. Or, in a case where the target control signal is in the fourth state, the refresh control circuit is adjusted to an off state to not perform the power supply operation.

In some embodiments, the operation that pulse combination and logic operation processing are performed on the refresh command signal to obtain the target control signal may include the following operations.

Pulse combination processing is performed on the refresh command signal to obtain a refresh combined signal. A logical operation is performed on the refresh command signal and the refresh combined signal to obtain the target control signal.

In a specific embodiment, the operation that pulse combination processing is performed on the refresh command signal to obtain the refresh combined signal may include the following operations.

Frequency division processing is performed on the refresh command signal in the first time period to obtain a frequency-divided signal. Inversion processing is performed on the frequency-divided signal to obtain the refresh combined signal. Herein, the number of pulses of the refresh command signal in the first time period is a fixed value. Signal reset processing is performed in the second time period to keep the level state of the refresh combined signal unchanged.

It is to be noted that the frequency division processing may be completed by a plurality of flip-flops and a plurality of inverters, which refers to FIG. 7 for details. Assuming that the first state refers to a high level state, and the second state refers to a low level state, as shown in FIG. 5, after the first rising edge of the refresh command signal in the first time period, the refresh combined signal is adjusted from the high level state to the low level state. After the N-th falling edge of the refresh command signal in the first time period, the refresh combined signal is adjusted from the low level state to the high level state. Then, in the second time period, since signal reset processing is performed, the level state of the refresh combined signal is kept unchanged until the refresh command signal generates a new pulse.

In this way, after the first signal edge of the refresh command signal in the first time period, the refresh combined signal is adjusted from the first state to the second state. After the last signal edge of the refresh command signal in the first time period, the refresh combined signal is controlled to be adjusted from the second state to the first state until the arrival of the next first time period. In a specific embodiment, the level change of the refresh command signal and the level change of the refresh combined signal are shown in FIG. 5. Correspondingly, the operation that the logical operation is performed on the refresh command signal and the refresh combined signal to obtain the target control signal may include the following operations.

A NOR operation is performed on the refresh command signal and a first intermediate processing signal to obtain a second intermediate processing signal. Herein, the first intermediate processing signal is obtained by performing the NOR operation on the refresh combined signal and the second intermediate processing signal. The NOT operation is performed on the second intermediate processing signal to obtain the target control signal.

In this way, the rising edge of the target control signal is aligned with the first signal edge of the refresh command signal in the first time period, and the falling edge of the target control signal is aligned with the rising edge of the refresh combined signal, so that the third state of the target control signal may completely cover the first time period to ensure that the plurality of refresh operations may be performed normally.

The embodiments of the present disclosure provide a refresh control method. By optimizing the refresh control, the plurality of refresh operations may be performed in a centralized manner, which may greatly reduce the switching times of the power supply operations, thereby achieving the purpose of reducing current consumption.

The above are only the preferred embodiments of the present disclosure, and are not intended to limit the scope of protection of the present disclosure. It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element. The sequence numbers of the embodiments of the present disclosure are adopted not to represent superiority-inferiority of the embodiments but only for description. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiment. The features disclosed in several method or device embodiments provided in the present disclosure may be combined arbitrarily without conflict to obtain new method embodiments or device embodiments. The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

The embodiments of the present disclosure provide a refresh control circuit, a memory, and a refresh control method. A plurality of refresh operations are generated in a first time period, so that the power supply operation is performed in a centralized manner in the first time period. Therefore, for the plurality of refresh operations, the power supply circuit only needs to be switched on and off once, which reduces the switching times of the power supply circuit, saves the current loss, and improves the performance of the memory.

What is claimed is:

1. A refresh control circuit, applicable to a memory and comprising:
    a processing circuit, configured to receive a refresh command signal, and perform pulse combination processing on the refresh command signal to obtain a refresh combined signal, wherein the refresh command signal has a plurality of pulses in a first time period and keeps a level state unchanged in a second time period, and the first time period and the second time period exist alternately;
    a logic circuit, configured to receive the refresh command signal and the refresh combined signal, and perform logical operation processing on the refresh command signal and the refresh combined signal to obtain a target control signal, wherein the target control signal has different level states in the first time period and the second time period; and
    a power supply circuit, configured to receive the target control signal, and determine whether to perform a power supply operation according to a level state of the target control signal, the power supply operation being configured to support execution of a refresh operation;
    wherein the processing circuit is configured to control the refresh combined signal to be adjusted from a first state to a second state according to a first signal edge of the refresh command signal in the first time period, and control the refresh combined signal to be adjusted from the second state to the first state according to a last signal edge of the refresh command signal in the first time period.

2. The refresh control circuit of claim 1, wherein the processing circuit comprises a frequency divider and a first inverter; wherein,
    the frequency divider is configured to receive the refresh command signal, and perform frequency division processing on the refresh command signal to obtain a frequency-divided signal;
    the first inverter is configured to receive the frequency-divided signal, and perform inversion processing on the frequency-divided signal to obtain the refresh combined signal;
    wherein a number of pulses of the refresh command signal in the first time period is a fixed value.

3. The refresh control circuit of claim 2, wherein the processing circuit is further configured to perform reset processing on the frequency divider in the second time period.

4. The refresh control circuit of claim 2, wherein the frequency divider comprises A flip-flops and A second inverters; wherein,
    an input end of an i-th flip-flop is connected with an output end of an i-th second inverter, and an output end of the i-th flip-flop is connected with an input end of the i-th second inverter;
    a clock end of a first flip-flop is configured to receive the refresh command signal; when i is greater than or equal to 2, a clock end of the i-th flip-flop is connected with an output end of an (i-1)-th flip-flop, and an output end of an A-th flip-flop is configured to output the frequency-divided signal;
    wherein A is a positive integer greater than 1, and i is a positive integer less than or equal to A.

5. The refresh control circuit of claim 1, wherein the target control signal is in a third state in the first time period, and the target control signal is in a fourth state in all or part of the second time period; and
    the power supply circuit is configured to be adjusted, in a case where the target control signal is in the third state, to an on state to perform the power supply operation; or, to be adjusted, in a case where the target control signal is in the fourth state, to an off state to perform no power supply operation.

6. The refresh control circuit of claim 5, wherein the first state and the third state are both high level states, and the second state and the fourth state are both low level states.

7. The refresh control circuit of claim 6, wherein the logic circuit comprises a first NOR gate, a second NOR gate, and a third inverter; wherein,
    a first input end of the first NOR gate is connected with the refresh command signal, and a first input end of the second NOR gate is connected with the refresh combined signal;
    a second input end of the first NOR gate is connected with an output end of the second NOR gate, and a second input end of the second NOR gate and an input end of the third inverter are both connected with an output end of the first NOR gate; and
    an output end of the third inverter is configured to output the target control signal.

8. A memory, comprising a refresh controller and a refresh control circuit; wherein,
    the refresh controller is configured to generate a refresh command signal, the refresh command signal having a plurality of pulses in a first time period and keeping a level state unchanged in a second time period, and the first time period and the second time period existing alternately; and
    the refresh control circuit is configured to receive the refresh command signal, and perform pulse combination and logic operation processing on the refresh command signal to obtain a target control signal, the target control signal having different level states in the first time period and the second time period, and determine whether to perform a power supply operation according to a level state of the target control signal, the power supply operation being configured to support execution of a refresh operation;
    wherein the refresh control circuit comprising:
    a processing circuit, configured to receive a refresh command signal, and perform pulse combination processing on the refresh command signal to obtain a refresh combined signal, wherein the refresh command signal has a plurality of pulses in a first time period and keeps a level state unchanged in a second time period, and the first time period and the second time period exist alternately; and a logic circuit, configured to receive the refresh command signal and the refresh combined signal, and perform logical operation processing on the refresh command signal and the refresh combined signal to obtain a target control signal, wherein the target control signal has different level states in the first time period and the second time period;

wherein the processing circuit is configured to control the refresh combined signal to be adjusted from a first state to a second state according to a first signal edge of the refresh command signal in the first time period, and control the refresh combined signal to be adjusted from the second state to the first state according to a last signal edge of the refresh command signal in the first time period.

9. The memory of claim 8, wherein the target control signal is in a third state in the first time period, and the target control signal is in a fourth state in all or part of the second time period;

the refresh control circuit comprises a power supply circuit, and is further configured to adjust, in a case where the target control signal is in the third state, the power supply circuit to an on state to perform the power supply operation; or, adjust, in a case where the target control signal is in the fourth state, the power supply circuit to an off state to perform no power supply operation.

10. The memory of claim 8, further comprising:
a memory array, connected with the refresh controller and the refresh control circuit, and configured to receive the refresh command signal and perform, in a case where the refresh control circuit performs the power supply operation, the refresh operation once according to a pulse in the refresh command signal.

11. A refresh control method, applicable to a memory comprising a refresh control circuit, and the method comprising:
determining a refresh command signal, the refresh command signal having a plurality of pulses in a first time period and keeping a level state unchanged in a second time period, and the first time period and the second time period existing alternately;
performing pulse combination and logic operation processing on the refresh command signal to obtain a target control signal, the target control signal having different level states in the first time period and the second time period; and
determining whether the refresh control circuit performs a power supply operation according to a level state of the target control signal, the power supply operation being configured to support execution of a refresh operation;
wherein performing pulse combination and logic operation processing on the refresh command signal to obtain the target control signal comprises:
performing pulse combination processing on the refresh command signal to obtain a refresh combined signal; and
performing a logical operation on the refresh command signal and the refresh combined signal to obtain the target control signal;
wherein performing pulse combination processing on the refresh command signal to obtain a refresh combined signal comprises:

controlling the refresh combined signal to be adjusted from a first state to a second state according to a first signal edge of the refresh command signal in the first time period, and controlling the refresh combined signal to be adjusted from the second state to the first state according to a last signal edge of the refresh command signal in the first time period.

12. The refresh control method of claim 11, wherein the target control signal is in a third state in the first time period, and the target control signal is in a fourth state in all or part of the second time period;

determining whether the refresh control circuit performs a power supply operation according to the level state of the target control signal comprises:
adjusting, in a case where the target control signal is in the third state, a power supply circuit in the refresh control circuit to an on state to perform the power supply operation; or,
adjusting, in a case where the target control signal is in the fourth state, the power supply circuit in the refresh control circuit to an off state to perform no power supply operation.

13. The refresh control method of claim 11, further comprising:
controlling, in a case where the refresh control circuit performs the power supply operation, the memory to perform the refresh operation once according to a pulse in the refresh command signal.

14. The refresh control method of claim 11, wherein performing pulse combination processing on the refresh command signal to obtain the refresh combined signal comprises:
performing frequency division processing on the refresh command signal in the first time period to obtain a frequency-divided signal;
performing inversion processing on the frequency-divided signal to obtain the refresh combined signal, wherein a number of pulses of the refresh command signal in the first time period is a fixed value; and
performing signal reset processing in the second time period to keep the level state of the refresh combined signal unchanged.

15. The refresh control method of claim 14, wherein the frequency division processing is performed by a plurality of flip-flops and a plurality of inverters in the memory.

16. The refresh control method of claim 11, wherein performing the logical operation on the refresh command signal and the refresh combined signal to obtain the target control signal comprises:
performing a NOR operation on the refresh command signal and a first intermediate processing signal to obtain a second intermediate processing signal, wherein the first intermediate processing signal is obtained by performing the NOR operation on the refresh combined signal and the second intermediate processing signal; and
performing a NOT operation on the second intermediate processing signal to obtain the target control signal.

17. The refresh control method of claim 11, wherein a rising edge of the target control signal is aligned with a first signal edge of the refresh command signal in the first time period, and a falling edge of the target control signal is aligned with a rising edge of the refresh combined signal.

18. The refresh control method of claim 11, wherein the memory is a Dynamic Random Access Memory (DRAM).

* * * * *